United States Patent
Senda et al.

(10) Patent No.: US 7,253,450 B2
(45) Date of Patent: Aug. 7, 2007

(54) LIGHT-EMITTING DEVICE

(75) Inventors: Masanobu Senda, Aichi-ken (JP); Jun Ito, Aichi-ken (JP); Koichi Goshonoo, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 0 days.

(21) Appl. No.: 10/926,342

(22) Filed: Aug. 26, 2004

(65) Prior Publication Data

US 2005/0056831 A1 Mar. 17, 2005

(30) Foreign Application Priority Data

Sep. 17, 2003 (JP) ............... 2003-325120

(51) Int. Cl.
*H01L 29/24* (2006.01)
*H01L 29/22* (2006.01)

(52) U.S. Cl. .................... 257/100; 257/95; 257/96; 257/81; 257/99; 257/79; 257/E33.059; 313/498; 313/502; 313/512

(58) Field of Classification Search ............. 257/99, 257/100, 79, 95, 98, E33.059, E33.056, E33.058, 257/96, 81; 313/498, 512, 502
See application file for complete search history.

(56) References Cited

U.S. PATENT DOCUMENTS 6,777,871 B2 * 8/2004 Duggal et al. .............. 313/506
7,023,022 B2 * 4/2006 Eliashevich et al. .......... 257/98
2002/0084745 A1 * 7/2002 Wang et al. ................ 313/498
2006/0022356 A1 * 2/2006 Uwada et al. .............. 257/787

FOREIGN PATENT DOCUMENTS

JP 2002-319708 10/2002

* cited by examiner

*Primary Examiner*—Jerome Jackson
*Assistant Examiner*—Joseph Nguyen
(74) *Attorney, Agent, or Firm*—McGinn IP Law Group, PLLC

(57) ABSTRACT

A foam-holding body 52 having a large difference in refractive index between foams 521 and the surrounding material is disposed on the major light extraction surface of the sapphire substrate 50. The foam-holding body 52 has translucency to light of a light-emitting wavelength and is formed of a material such as a silicone or the like, having a refractive index equal to or more than 1.77, and includes a foam-holding layer holding a plurality of foams made of an air or an inactive gas having a refractive index of about one. Therefore, when the light emitted in the light-emitting portion scatters in the foam-holding body 52, the spread of the scattered light becomes wide, which restricts repetition of the total reflection in the light-emitting device to improve an efficiency of the light extraction.

7 Claims, 5 Drawing Sheets

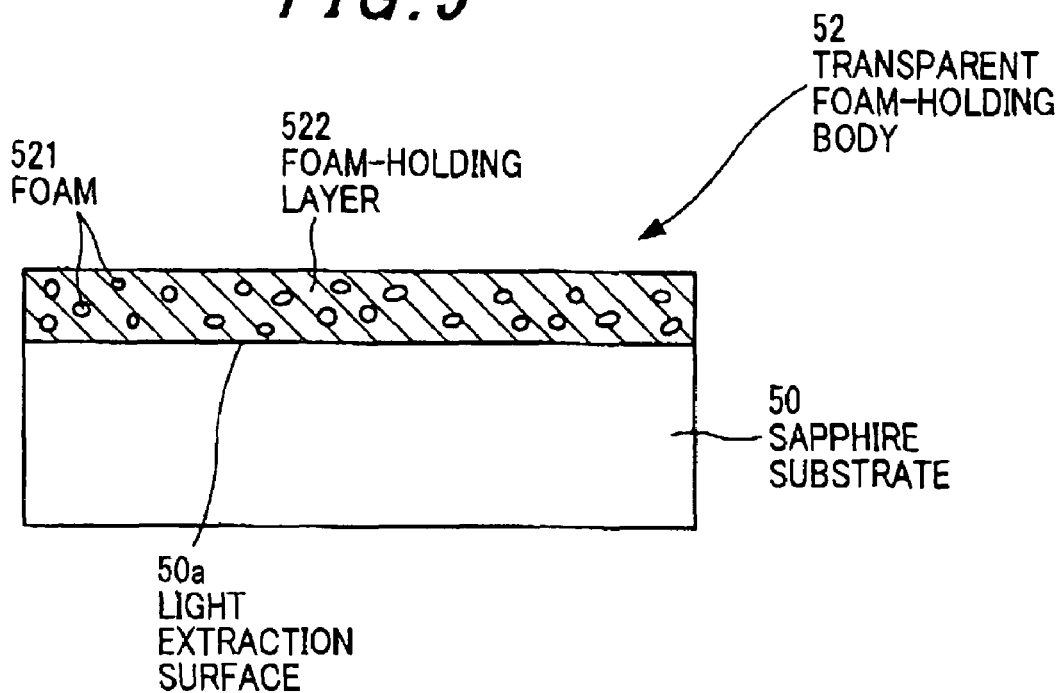
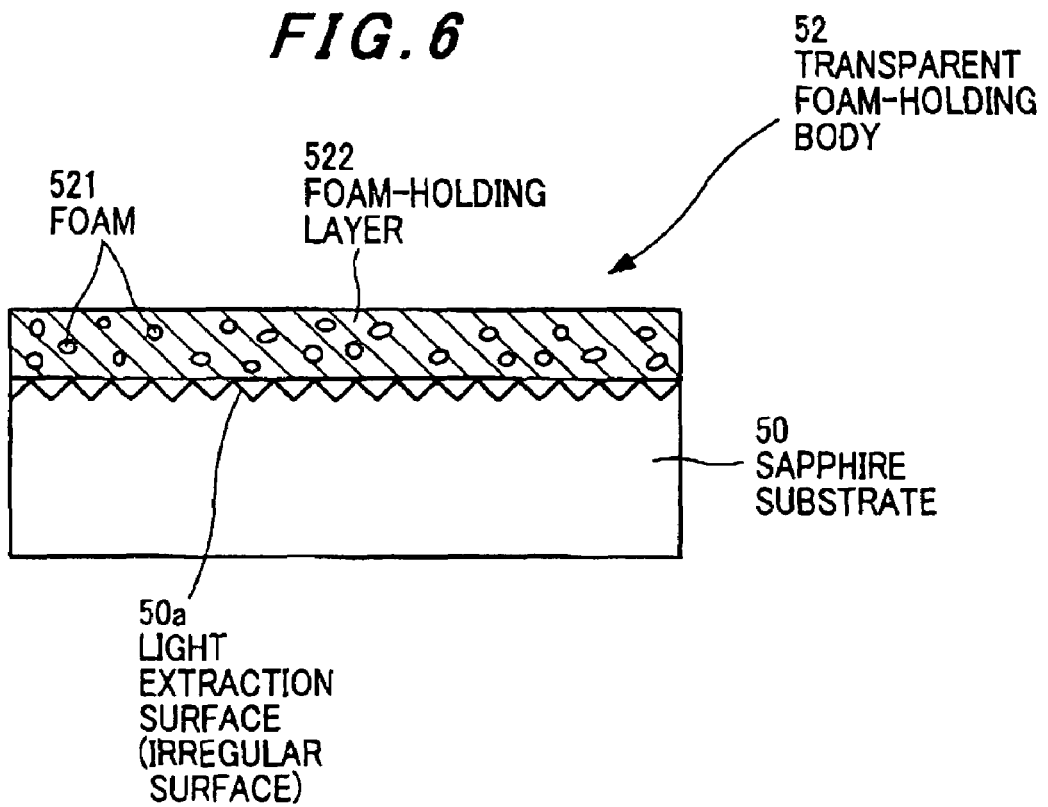

LIGHT-EMITTING DEVICE

The present application is based on Japanese patent application No. 2003-325120, the entire contents of which are incorporated herein by reference.

BACKGROUND OF THE INVENTION

1. Field of the Invention

The present invention relates to a light-emitting device which emits light from a light-emitting element such as a light-emitting diode (referred to as LED hereinafter) and in particular, to a light-emitting device with a high efficiency of light extraction.

2. The Related Art of the Invention

There is well known an earlier LED chip with an improved efficiency of light extraction, for instance, a LED chip with a convex and a concave portion formed on a light extraction side in a substrate (refer to Japanese Unexamined Patent Publication No. 2002-319708 (Paragraphs [0022]-[0024], FIG. 2)).

FIG. 1 shows the earlier LED chip. The LED chip 100 forms on a sapphire substrate 101 a nitride semiconductor layer made of a GaN buffer layer 102, an n-type semiconductor layer 103, and a p-type semiconductor layer 104. Further, a p-side electrode 105 is disposed on the p-type semiconductor layer 104 and an n-side electrode 106 is disposed on the n-type semiconductor layer 103. The LED chip 100 is flip chip bonded on a mounting substrate 110 by bumps 130a and 130b. And a surface of the sapphire substrate 101 opposite to a surface where the nitride semiconductor layer is formed is grinded by an abrasive with a regulated size of particles, to form irregular surfaces 110a and 101b having a depth of approximately 1 µm. Since light emitted at a light-emitting portion of the nitride semiconductor layer is reflected in random directions by these irregular surfaces, repetition of total reflection of light inside the LED chip 100 is restricted to improve light extraction efficiency.

SUMMARY OF THE INVENTION

According to the earlier LED chip, however, in case the LED chip is sealed by a resin sealant, a refractive index of the sapphire substrate is 1.77 and on the other hand, a refractive index of the resin sealant in contact with the irregular surfaces of the sapphire substrate is 1.5 and further, a difference in refractive index therebetween is thus small. Therefore, spread of scattered light produced on the irregular surfaces of the sapphire substrate is made small. Accordingly repetition of total reflection of light in the LED chip can not be sufficiently controlled and thereby it is difficult to further improve an efficiency of light extraction.

In view of the above, there exists a need for a light-emitting device which overcomes the above-mentioned problems in the related art. The present invention addresses this need in the related art as well as other needs, which will become apparent to those skilled in the art from this disclosure.

Accordingly an object of the present invention is to provide a light-emitting device with a high efficiency of light extraction as the entire device due to increasing light scattering to widen distribution of light.

The present invention is, in order to achieve the above-described object, to provide a light-emitting device which comprises a substrate having translucency to light of a predetermined wavelength, a semiconductor layer formed on the substrate and having an active portion which emits light in the predetermined wavelength, and a foam-holding body formed on the substrate and having translucency to the light of the predetermined wavelength.

The foam-holding body is preferably formed on a surface of the substrate opposite to a surface where the semiconductor of the substrate is formed.

The foam-holding body is preferably formed on a side surface of the substrate.

It is preferable that the substrate includes an irregular surface on the surface of the substrate opposite to a surface where the semiconductor layer of the substrate is formed and the foam-holding body is formed on the irregular surface.

The substrate preferably includes an irregularity-forming layer on a surface of the substrate, which has the irregular surface.

The irregularity-forming layer is preferably formed by evaporating particles of $SiO_2$, $Al_2O_3$ or ITO on the surface of the substrate to produce the irregular surface.

The substrate may include the irregular surface on the surface thereof formed by etching.

The foam-holding body is preferably a sheet-like member to be bonded to the surface of the substrate.

The foam-holding body includes a material holding foams, wherein the material preferably has a refractive index equal to or more than 1.77.

According to the light-emitting device of the present invention, due to disposition of the foam-holding body having a large difference in refractive index between the foams and the surrounding material on the major light extraction surface, when the light emitted in the light-emitting portion scatters in the foam-holding body, the spread of the scattered light becomes wide, which restricts repetition of the total reflection of light produced in the light-emitting device to improve an efficiency of the light extraction.

These and other objects, features, aspects and advantages of the present invention will become apparent to those skilled in the art from the following detailed description, which, taken in conjunction with the annexed drawings, discloses a preferred embodiments of the present invention.

BRIEF DESCRIPTION OF THE DRAWINGS

Referring now to the attached drawings which form a part of this original disclosure:

FIG. 5 is a cross sectional view showing a transparent foam-holding body of a second embodiment according to the present invention; and FIG. 6 is a cross sectional view showing a transparent foam-holding body of a third embodiment according to the present invention.

DETAILED DESCRIPTION OF THE PREFERRED EMBODIMENTS

Selected embodiments of the present invention will now be explained with reference to the drawings. It will be apparent to those skilled in the art from this disclosure that the following description of the embodiments of the present invention is provided for illustration only, and not for the purpose of limiting the invention as defined by the appended claims and their equivalents.

First Embodiment

Figure 1:
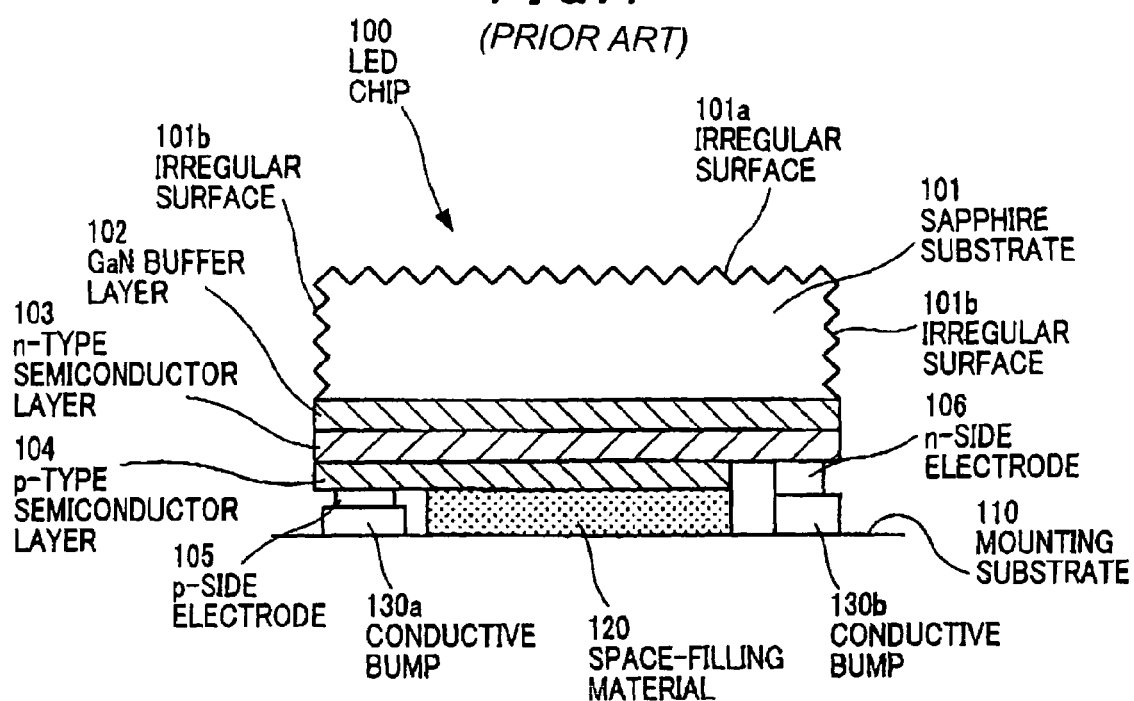
FIG. 1 is a cross sectional view showing an earlier LED chip.
Figure 2:
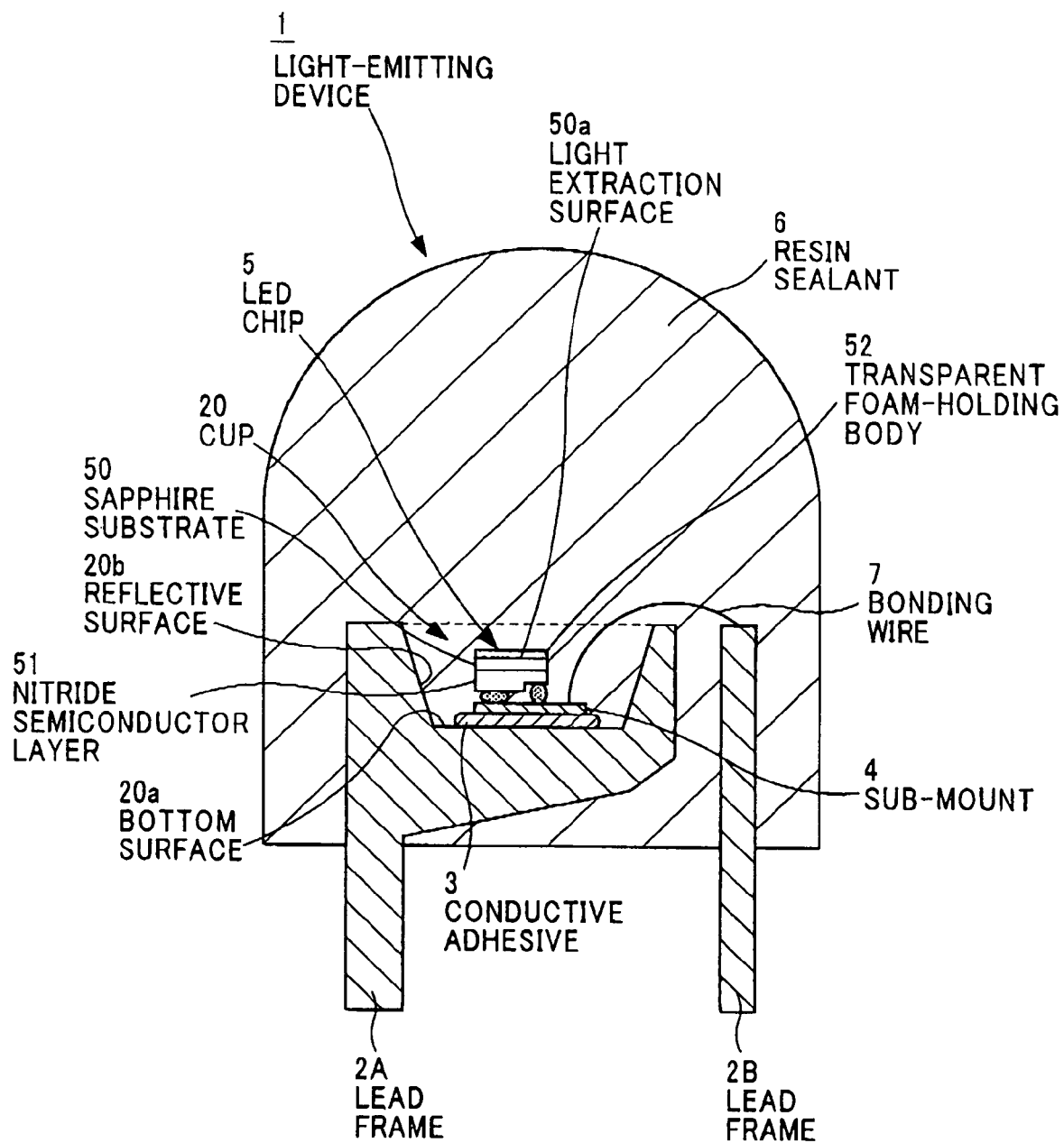
FIG. 2 is a cross sectional view showing an light-emitting device of a first embodiment according to the present invention.

FIG. 2 shows a light-emitting device of a first embodiment according to the present invention. A light-emitting device 1 includes a pair of lead frames 2A and 2B made of metal such as a copper alloy or an aluminum alloy having a good heat conductivity, a cup 20 formed on a top end of the lead frame 2A and having a reflective surface 20b in the periphery thereof, a sub-mount 4 bonded to a bottom surface 20a of the cup 20 by a conductive adhesive 3 such as an Ag paste, a LED chip 5 flip chip bonded on the sub-mount 4, a bonding wire 7 electrically connecting the sub-mount 4 to the lead frame 2B, and a bombshell-shaped resin sealant 6 having translucency to light of a light-emitting wavelength of the LED chip 5, wherein the resin sealant 6 seals a part of the pair of the lead frames 2A and 2B, the LED chip 5, and the bonding wire 7, as well as gives directional characteristics to light-emitting light of the LED chip 5.

The LED chip 5 is provided with a substrate having translucency to light of a light-emitting wavelength, for instance, a sapphire substrate 50, a nitride semiconductor layer 51 formed on the sapphire substrate 50 and including a light-emitting portion, and a transparent foam-holding body 52 formed on a surface (light extraction surface) 50a opposite to a surface where the nitride semiconductor layer 51 of the sapphire substrate 50 is formed.

Figure 3:
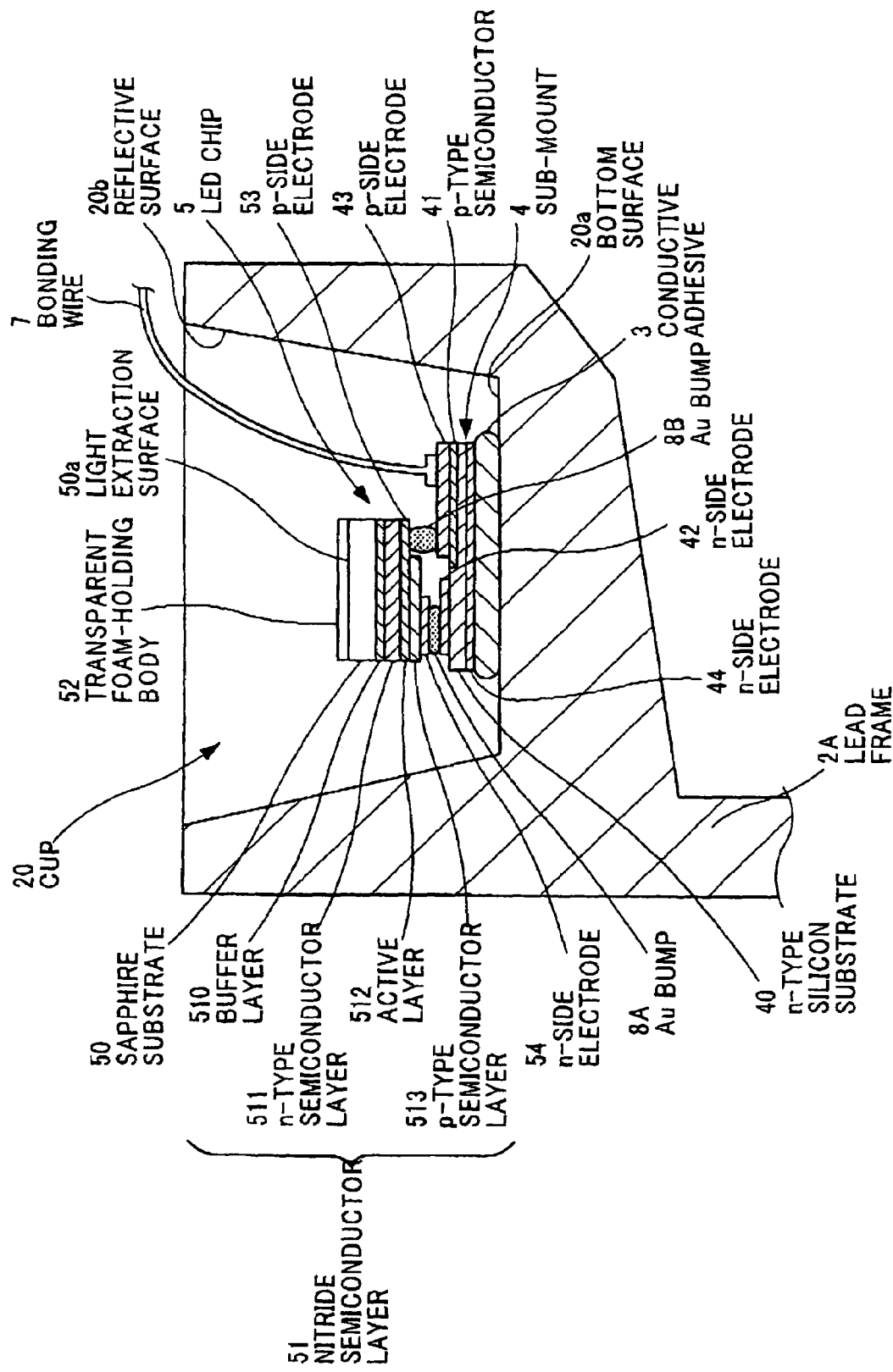
FIG. 3 is a cross sectional view showing a sub-mount and a LED chip in detail of the first embodiment according to the present invention.

FIG. 3 shows a detail of the sub-mount 4 and the LED chip 5. The sub-mount 4 includes an n-type silicon substrate 40, a p-type semiconductor 41 formed in a part of the n-type silicon substrate 40, an n-side electrode 42 disposed on an upper surface of the n-type silicon substrate 40, a p-side electrode 43 disposed on an upper surface of the p-type semiconductor 41, and an n-side electrode 44 disposed on a bottom surface of the n-type silicon substrate 40.

The LED chip 5 forms on the sapphire substrate 50 the nitride semiconductor layer 51 including a buffer layer 510, an n-type semiconductor layer 511, an active layer 512 forming the light-emitting portion, and a p-type semiconductor layer 513 where an n-side electrode 54 is disposed on the p-type semiconductor layer 513 and a p-side electrode 53 is disposed on the n-type semiconductor layer 511. The LED chip 5 is flip chip bonded on the sub-mount 4 by connecting then-side electrode 42 and the p-side electrode 43 of the sub-mount 4 to the n-side electrode 54 and the p-side electrode 53 of the LED chip 5 with Au bumps 8A and 8B.

Figure 4:
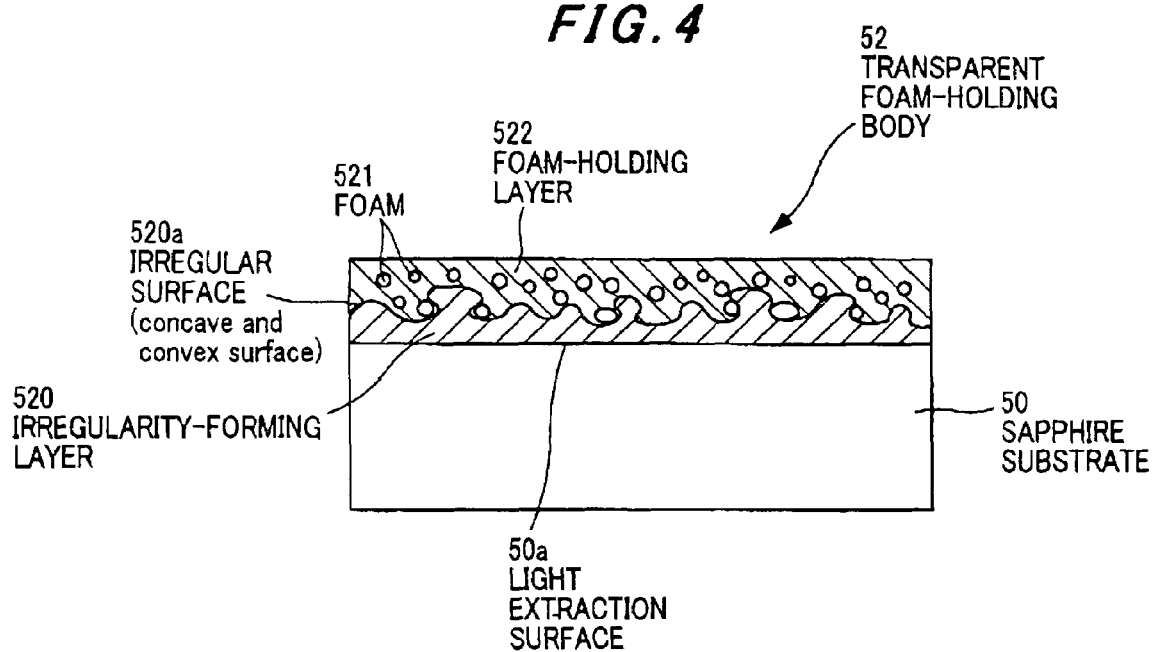
FIG. 4 is a cross sectional view showing a transparent foam-holding body of the first embodiment according to the present invention.

FIG. 4 shows a detail of a transparent foam-holding body 52. The transparent foam-holding body 52 includes an irregularity-forming layer 520 formed on a light extraction surface 50a of the sapphire substrate 50, and a foam-holding layer 522 formed on the irregularity-forming layer 520 and holding foams 521.

The irregularity-forming layer 520 forms an irregular surface 520a, for instance, a micro concave and a micro convex surface in a complicated shape by evaporating particles of $SiO_2$ $Al_2O_3$, ITO or the like on the light extraction surface 50a of the sapphire substrate 50, which includes overhang portions suitable for trapping the foams 521.

The foam-holding layer 522 has translucency to light of a light-emitting wavelength and is formed of a material such as a silicone having a refractive index equal to or more than 1.77, and holds a plurality of foams 521 formed of an air or an inactive gas which has a refractive index of approximately 1. The foam-holding layer 522 is formed such that a silicone in a fluidized state having a plurality of foams 521 at a high temperature is supplied on the irregularity-forming layer 520, and the foams 521 are trapped by the overhang portions of the irregular surface 520a, which thereafter, are hardened by cooling for forming.

According to the first embodiment, since a refractive index of the foams 521 is smaller than a refractive index of the foam-holding layer 522 surrounding the foams 521, and further, a difference in refractive index between the foams 521 and the foam-holding layer 522 surrounding the foams 521 is large, when the light emitted at the light-emitting portion is scattered in the foam-holding body 52, the spread of the scattered light becomes widened to restrict repetition of the total reflection of the light inside light-emitting device 1, enabling a further improvement of an efficiency of light extraction. And the irregular surface 520a of the irregularity-forming layer 520 includes the overhang portions, and therefore, the irregular surface 520a can hold many foams 521. Further, due to the irregular surface 520a in a complicated shape, the light-emitting light can be reflected by the irregular surface 520a at random directions, to improve an efficiency of light extraction with the help of the transparent foam-holding body 52.

Second Embodiment

FIG. 5 shows a transparent foam-holding body of a second embodiment according to the present invention. The transparent foam-holding body 52 is formed by bonding a sheet-shaped foam-holding layer 522 having the foams 521 produced by an injection foam molding method to the light extraction surface 50a of the sapphire substrate 50. According to the second embodiment, in the same way as in the first embodiment, since a difference in refractive index between the foam 521 of the transparent foam-holding body 52 and the foam-holding layer 522 surrounding the foams 521 is large, when the light emitted at the light-emitting portion is scattered in the transparent foam-holding body 52, the spread of the scattered light becomes widened to restrict repetition of the total reflection of the light inside light-emitting device 1, enabling a further improvement of an efficiency of light extraction.

Third Embodiment

FIG. 6 shows a transparent foam-holding body of a third embodiment according to the present invention. The transparent foam-holding body 52 is formed such that an irregular surface is formed by etching the light extraction surface 50a of the sapphire substrate 50 chemically or mechanically and the foam-holding layer 522 holding foams 521 is, as shown in FIG. 4, bonded on the irregular surface of the light extraction surface 50a. According to the third embodiment, since light scattering is produced doubly caused by the irregular surface and the transparent foam-holding body 52, repetition of total reflection is restricted to improve an efficiency of light extraction.

However, in each of the first and second embodiments the transparent foam-holding body is disposed on a surface opposite to a surface where the nitride semiconductor of the sapphire substrate is formed and may be also disposed on a side surface of the sapphire substrate.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention is provided for illustration only, and not for the purpose of limiting the invention as defined by the appended claims and their equivalents.

What is claim is:

1. A light-emitting device, comprising:
   a substrate having translucency to light of a predetermined wavelength;
   a semiconductor layer formed on the substrate and having an active portion which emits light in the predetermined wavelength;
   a foam-holding body formed on the substrate and having translucency to the light of the predetermined wavelength; and
   a foam-trapping layer formed between the substrate and the foam-holding body,
   wherein the foam-trapping layer is adapted to trap a foam included in the foam-holding body.

2. The light-emitting device as defined in claim 1, wherein the foam-holding body is formed on a surface of the substrate opposite to a surface where the semiconductor layer on the substrate is formed.

3. The light-emitting device as defined in claim 2, wherein the foam-holding body is formed on a side surface of the substrate.

4. The light-emitting device as defined in claim 1, wherein the foam-trapping layer comprises an overhang portion for trapping the foam.

5. The light-emitting device as defined in claim 4, wherein the foam-trapping layer further comprises particles of at least one of $SiO_2$, $Al_2O_3$ and ITO.

6. The light-emitting device as defined in claim 1, wherein
   the foam-holding body comprises a refractive index equal to or more than 1.77 and the foam comprises a refractive index equal to approximately 1.

7. The light-emitting device as defined in claim 1, further comprising:
   a resin sealant encasing said substrate, said semiconductor layer, and said foam-holding body, said resin sealant having a refractive index less than 1.77,
   wherein the foam-holding body comprises a refractive index equal to or more than 1.77 and the foam comprises a refractive index equal to approximately 1.

* * * * *